(12) United States Patent
Straus

(10) Patent No.: US 6,857,711 B1
(45) Date of Patent: Feb. 22, 2005

(54) STABILIZED CABINET ENCLOSURE AND STABILIZER THEREFOR

(75) Inventor: Albert E. Straus, Timonium, MD (US)

(73) Assignee: Great Lakes Case & Cabinet Co., Inc., Edinboro, PA (US)

( * ) Notice: Subject to any disclaimer, the term of this patent is extended or adjusted under 35 U.S.C. 154(b) by 0 days.

(21) Appl. No.: 10/249,380

(22) Filed: Apr. 3, 2003

Related U.S. Application Data

(63) Continuation of application No. 10/282,887, filed on Oct. 28, 2002.

(51) Int. Cl.$^7$ .............................................. A47B 97/00
(52) U.S. Cl. ..................................... 312/205; 312/273
(58) Field of Search ................................. 312/205, 273, 312/274, 275, 276, 311, 351.8

(56) References Cited

U.S. PATENT DOCUMENTS

| | | | |
|---|---|---|---|
| 3,002,797 A | | 10/1961 | Stark |
| 3,058,320 A | | 10/1962 | Foster et al. |
| 3,150,904 A | * | 9/1964 | Kendt et al. ............... 312/276 |
| 3,150,905 A | * | 9/1964 | Payton et al. ............. 312/276 |
| 3,322,480 A | * | 5/1967 | Barnstead et al. ........ 312/276 |
| 3,393,950 A | * | 7/1968 | Dutcher ..................... 312/276 |
| 3,738,727 A | | 6/1973 | Race et al. |
| 3,741,620 A | * | 6/1973 | Kull et al. ................. 312/276 |
| 3,912,350 A | | 10/1975 | Gurubatham |
| 4,372,632 A | | 2/1983 | Villa et al. |
| 4,441,770 A | | 4/1984 | Brezosky |
| 4,590,709 A | * | 5/1986 | Katsman et al. .......... 312/276 |
| 4,624,511 A | * | 11/1986 | Oehme ..................... 312/273 |
| 4,687,262 A | | 8/1987 | St. Louis |
| 4,836,624 A | | 6/1989 | Schwickrath |
| 6,164,738 A | | 12/2000 | Dane et al. |
| 6,398,323 B1 | * | 6/2002 | Lee ........................... 312/205 |

FOREIGN PATENT DOCUMENTS

| | | | | |
|---|---|---|---|---|
| DE | 3320961 | * | 12/1984 | ............... 312/275 |
| GB | 7183 | * | 3/1887 | ............... 312/311 |

OTHER PUBLICATIONS

Electronic Industries Association, Standard Catalog for Cabinets, Racks, Panels and Associated Equipment, Sep. 1992.
Web Page, ITS Enclosures, Sep. 2002.
Web Page, Almetco Enclosures, Sep. 2002.
Web Page, Ultra Server, Sep. 2002.
Web Page, Cabtron Systems, Sep. 2002.
Web Page, Ergotron, Sep. 2002.
Great Lakes Case & Cabinet Co., Inc., Product Catalog 21, cover and p. 60.
Great Lakes Case & Cabinet Co., Inc., GL840ES–2942 Instruction Manual.

* cited by examiner

Primary Examiner—Lanna Mai
Assistant Examiner—Hanh V. Tran
(74) Attorney, Agent, or Firm—Edward W. Goebel, Jr.; Jon L. Woodard; MacDonald Illig Jones & Britton LLP

(57) ABSTRACT

A cabinet for storing vertically stacked items has a stabilizer. The cabinet has a door and a fixed base, the stabilizer adding to the total support base of the cabinet when extended. If fully extended, the stabilizer prevents tipping if the center of gravity of the cabinet shifts beyond the fixed base. The door automatically engages and extends the stabilizer when the door is initially opened from a closed position. The door continues to engage and extend the stabilizer until the stabilizer is fully extended. Once the stabilizer is fully extended, the door disengages the stabilizer if the door continues to be opened. When closed, the door returns to automatically re-engage and retract the stabilizer. If the stabilizer has been partially retracted during the interval in which the door has been open, the door will still re-engage and retract the stabilizer.

20 Claims, 5 Drawing Sheets

STABILIZED CABINET ENCLOSURE AND STABILIZER THEREFOR

CROSS REFERENCE TO RELATED APPLICATIONS

This application is a continuation of U.S. patent application Ser. No. 10/282,887 filed on Oct. 28, 2002 and entitled Expandable Server Cabinet which is incorporated herein by reference.

BACKGROUND OF INVENTION

Electronic component boxes such as computer servers are frequently stored in cabinets in dedicated locations such as central computer rooms. Electrical component or server cabinets can be used to store component boxes for security and for organizational and aesthetic purposes in these locations. Such locations also tend to be limited in floor space, making it necessary for individual component boxes to be stored vertically in a way that maximizes the usage of space that is available. For these reasons, for example, existing server cabinets are commonly available in a variety of fixed sizes, these cabinets typically being configured to store multiple computer servers In a stacked or vertical arrangement.

Many server cabinets are equipped with a front door which allows access to its interior from its front end. Server cabinets are typically equipped with slides on each side that allow each server to temporarily slide out past the front door to allow for quick access to internal components within the servers, without requiring complete removal of a server from its cabinet mounting. The front door typically remains open as each server is serviced. An example of one such server cabinet is described in my co-pending U.S. patent application Ser. No. 10/282,881.

Most server cabinets are designed so that the center of gravity of a particular cabinet is supported by the base of the cabinet when the cabinet is either empty or when one or more servers have been installed. However, when the front door is opened and as one or more servers are accessed, each server moves forward on a pair of slides and passes over the front door threshold in a way that may cause the center of gravity of the cabinet to temporarily shift past the fixed base of the cabinet. For this reason, it may be necessary to temporarily expand the support base of a cabinet with an appropriate additional support member while the servers are in a forward position.

Due to the limited amount of floor space that is normally available at dedicated locations used for server cabinets, it is often necessary for an external support member to be removable or retractable to normally make available the space that the support member occupies during the servicing of a server while it is in a forward position in a cabinet. However, when a cabinet support member is removable or manually extendable, its use becomes dependent on the initiative of the installer or remover of each server. Therefore, there is a risk that a person servicing a component box, being pressed for time, impatient, or otherwise not inclined to adhere to procedures, could attempt to install or unload a component box without making use of or fully extending the cabinet support member.

SUMMARY OF INVENTION

The invention is a stabilized cabinet that can store vertically stacked items such as electrical component boxes and a stabilizer therefor. The cabinet has a vertically extending door and a fixed base which is the support base of the cabinet when the door is closed. A stabilizer has a size and is positioned at a location on a cabinet which causes the stabilizer to expand the support base of the cabinet when the stabilizer is extended from the fixed base of the cabinet over floor space that is adjacent the location of the cabinet. If fully extended, the stabilizer leg will sufficiently expand the support base of the cabinet to prevent tipping if the center of gravity of the cabinet shifts beyond the fixed base of the cabinet.

The door and the stabilizer are configured to enable the door to automatically engage and extend the stabilizer when the door is initially opened from a closed position, allowing the stabilizer to be extended without requiring someone working with a component box to undertake an additional operational step.

As the door continues to be opened, the door continues to engage and extend the stabilizer until the stabilizer is fully extended. Once the stabilizer has been fully extended, the door automatically disengages the stabilizer if the door continues to be opened, allowing the door to swing freely.

After the door has been opened, the installer or remover may continue the installation or removal procedure by moving one or more component boxes past the threshold of the door. As this is done, the center of gravity of the combined cabinet and component boxes may temporarily move past the threshold of the door and past the fixed base of the cabinet. However, the center of gravity will remain over the expanded support base created by the extended stabilizer, and the cabinet will be prevented from tipping.

The door is also configured to return to the stabilizer and automatically re-engage and retract the stabilizer as the door is closed without requiring additional or manual operational steps to effect retraction. If the stabilizer has been bumped or otherwise partially retracted during the interval in which the door has been open, the configuration of the door and stabilizer will still allow the door to re-engage the stabilizer and will allow the stabilizer to retract.

Those skilled in the art will realize that this invention is capable of embodiments which are different from those shown and that details of the structure of the cabinet stabilizer described herein can be changed in various manners without departing from the scope of this invention. Accordingly, the drawings and descriptions are to be regarded as including such equivalent cabinet stabilizers as do not depart from the spirit and scope of this invention.

BRIEF DESCRIPTION OF DRAWINGS

For a more complete understanding and appreciation of this invention and many of its advantages, reference will be made to the following detailed description taken in conjunction with the accompanying drawings.

DETAILED DESCRIPTION

Figure 1A:
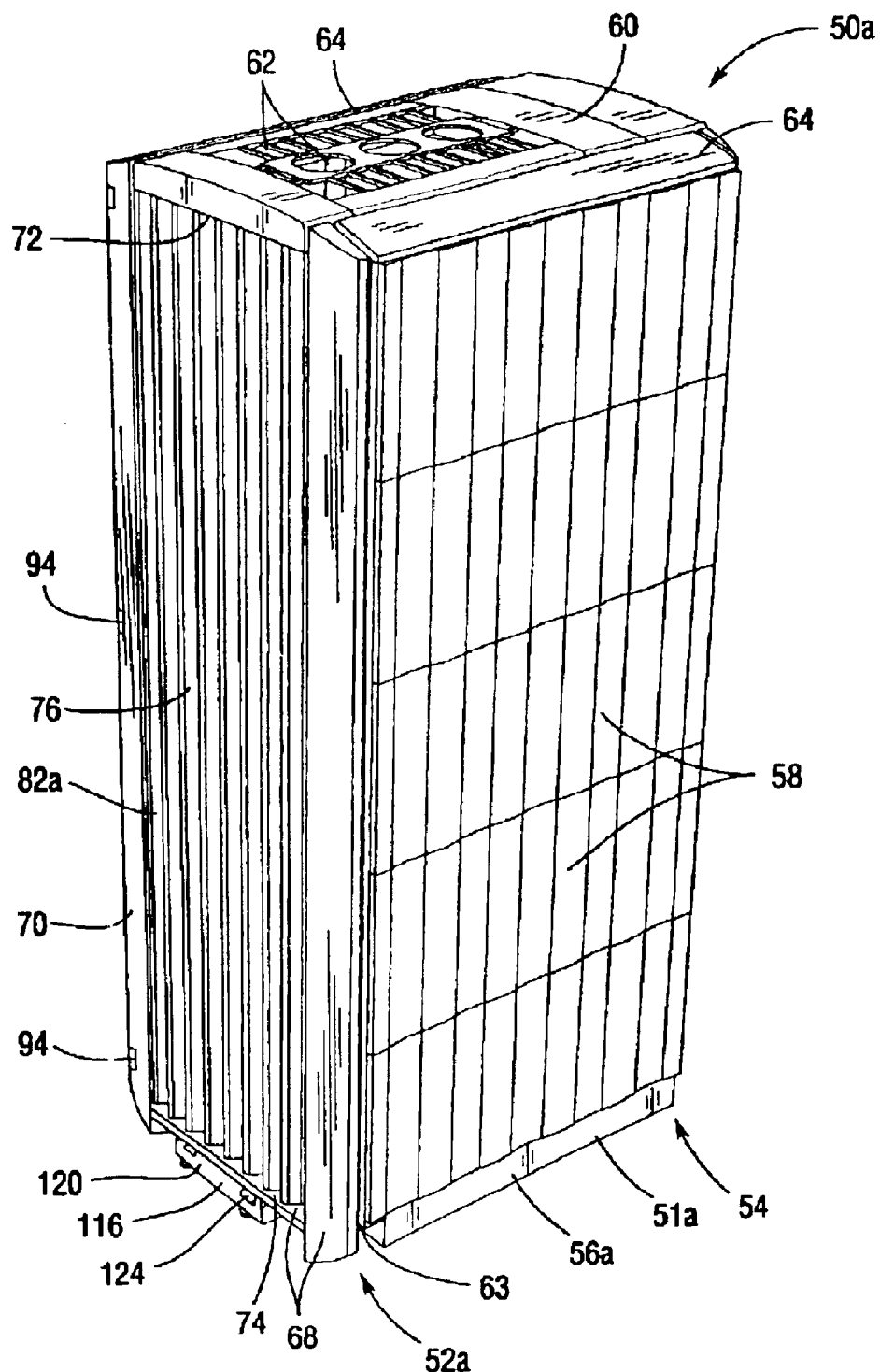
FIG. 1A is a perspective view of a cabinet having a closed front door and a retracted stabilizer according to the invention.

Referring to the drawings, identical reference numerals designate the same or corresponding part throughout the several figures as shown in the drawings. In some drawings, some specific embodiment variations in corresponding parts are denoted with the addition of lower case letters to reference numerals.

FIG. 1A depicts a typical cabinet 50a of the invention constructed around a cabinet frame 51a that includes a fixed base 56a, side panels 58, cover 60 and corner angles 64. Each of the corner angles extends from a front portion 52a to a back portion 54 of the cabinet 50a. The cover 60 may include ventilation passages 62 that allow air to pass into the interior of the cabinet 50 and which allow for the ventilation of electrical component boxes (not shown) contained therein.

A front door 82a is vertically mounted on hinges 94 at the front portion 52a to extend along the width of the cabinet 50a. The front door 82a includes a doorframe 68 having a top brace 12, bottom brace 74, and extruded side rails 70. A corrugated grille 76 extends between the top brace 72, bottom brace 74, and extruded side rails 70 of the front door 50a to allow for additional ventilation of the interior of the cabinet 50a.

Normally, electrical component boxes are stored in a vertically stacked fashion within the cabinet 50a, with center of gravity of the combined component boxes and cabinet 50a residing above the fixed base 56a of the cabinet frame 51a. However, most electrical component boxes are serviced while installed in the cabinet 50a by moving each component box on its slides over the threshold 63 of the front door 82a. This typically results in a disproportionate amount of weight being temporarily present at the front portion 52a of the cabinet 50a. This in turn can shift the center of gravity of the combined cabinet 50a and component boxes toward the front portion 52a of the cabinet 50a and possibly off of the fixed base 56a, reducing the stability of the cabinet 50a as each component box is serviced.

Figure 1B:
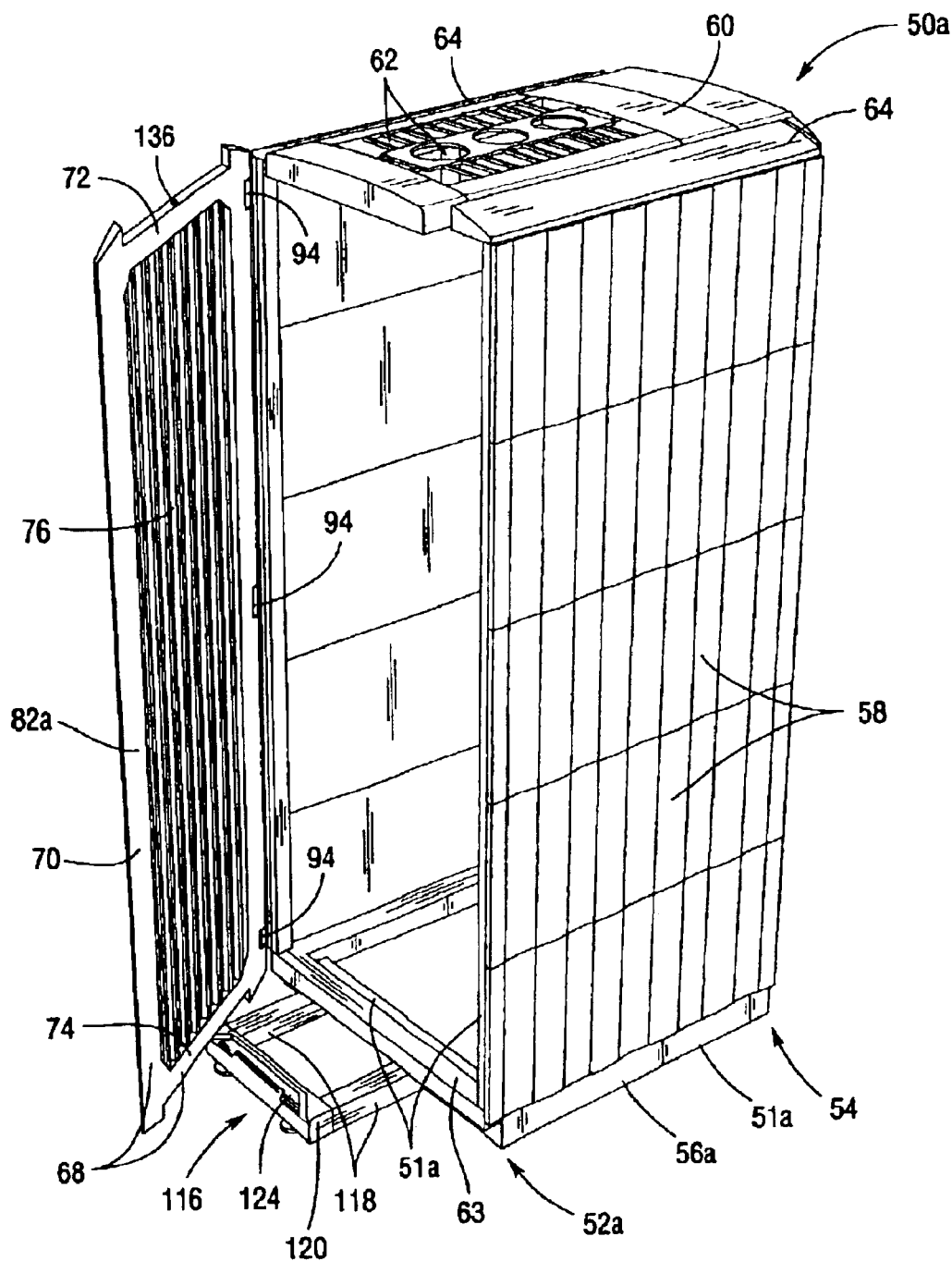
FIG. 1B is perspective view of the cabinet of claim 1A having an extended stabilizer and an open front door according to the invention.

As best understood with a comparison of FIGS. 1A and 1B, both the support base and overall stability can be increased with the addition of a stabilizer 116 to the fixed base 56a of the cabinet 50a, the stabilizer 116 being automatically extended, as depicted in FIG. 1B, when the front door 82a Is opened.

Figure 2:
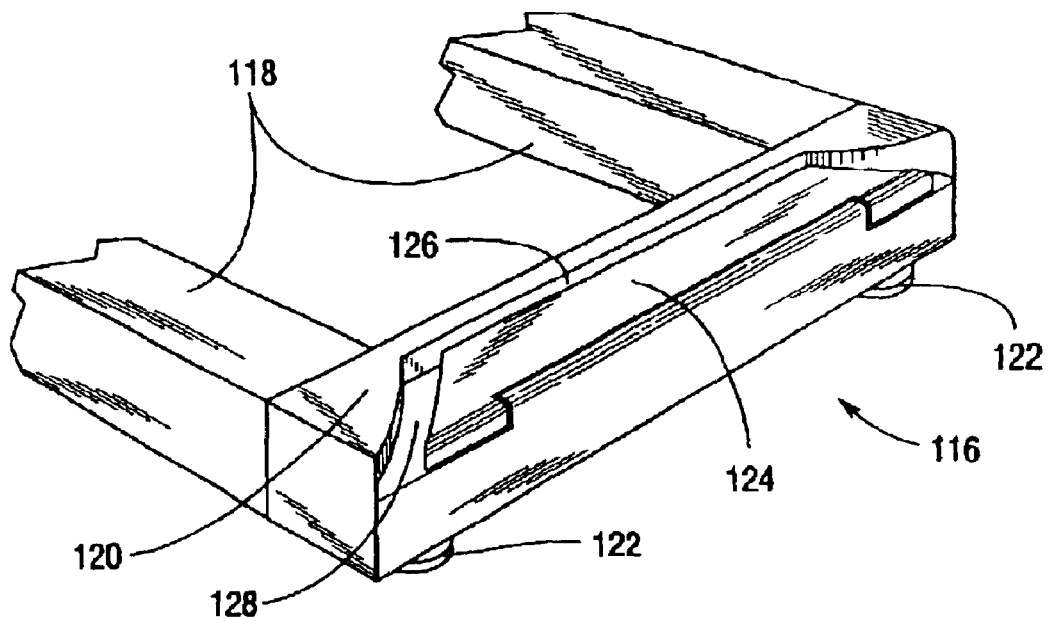
FIG. 2 is a magnified perspective view of the stabilizer of FIG. 1B.

A magnified view of the stabilizer 116 of FIGS. 1A and 1B is depicted in FIG. 2. The stabilizer 116 includes a pair of reciprocally mounted to fit within the fixed base 56a and to be extended from the front portion 52a of the cabinet 50a. A cross member 120 extends across the stabilizer 116 to connect the stabilizer legs 118 and to permit the stabilizer legs 118 to move in unison during extension from or retraction to the fixed base 56a. Glide legs 122 are positioned at either end of the cross member 120 to support the stabilizer 116 and to allow the stabilizer 116 to slide over floor space adjacent to the front portion 52a of the cabinet 50a when the front door 82 is opened.

The cross member 120 includes a spring loaded pin trap 124 extending along the length of the cross member 120. A pin track 126 is formed behind the pin trap 124 and against the cross member 120. The pin track 116 includes exit points 128 at either end of the pin trap 126 that open toward the front of the stabilizer 126.

Figure 3:
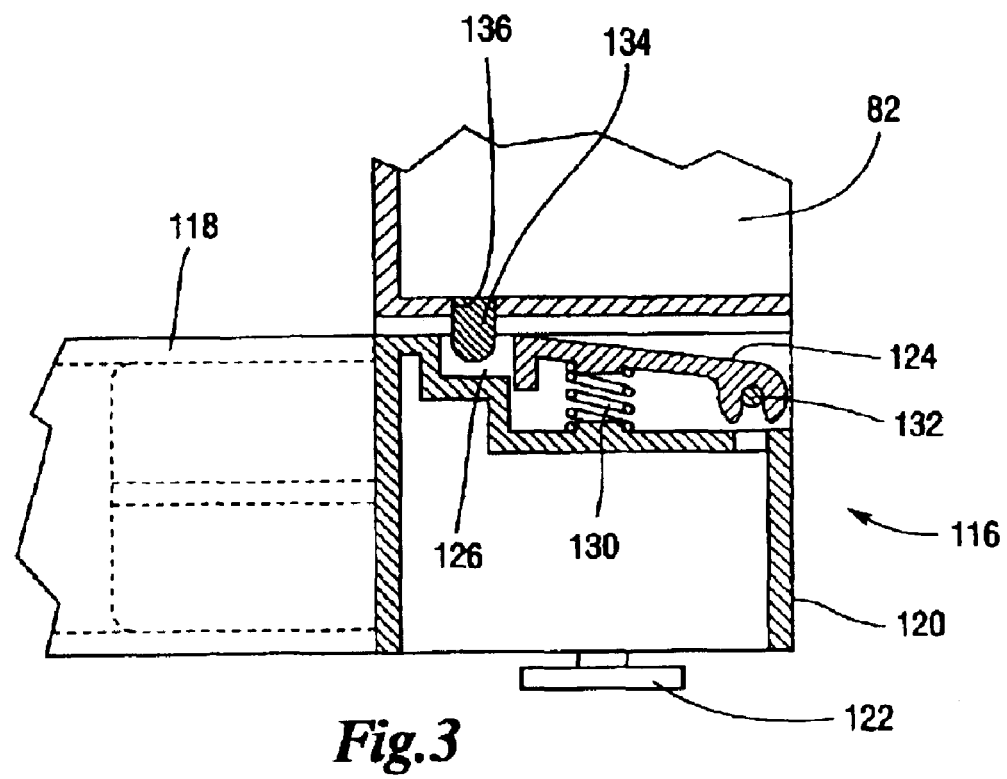
FIG. 3 is a cross sectional side view of the stabilizer of FIG. 2.

A cross sectional view of the stabilizer 116 is depicted in FIG. 3 showing the pin trap 124 biased with a trap spring 130 to an upward position on its pivot 132. The stabilizer 116 is shown with the front door 82a of the cabinet 50a positioned over the cross member 120 of the stabilizer 116. The front door 82a has a roller pin 134 that is positioned in a roller pinhole 136 located at a fixed position on the front door 82a. The roller pin 134 is removable and roller pinholes 136 are included at both the top and bottom of the front door 82a to allow for upside hinge reversal of the door.

The front door 82a is symmetrical along its horizontal centerline, allowing the front door 82a to be mounted either to open from the left (as shown in FIG. 1B) or from the right (not shown). This symmetry also allows the front door 82a and back door 66 to be interchangeable. Roller pinholes 136 are included on both the front door 82a and the back door 66 since the front door 82a and back door 66 are identical and interchangeable. The roller pin 134 is also shown to be in engagement with the pin track 126 of the cross member 120.

Figure 4A:
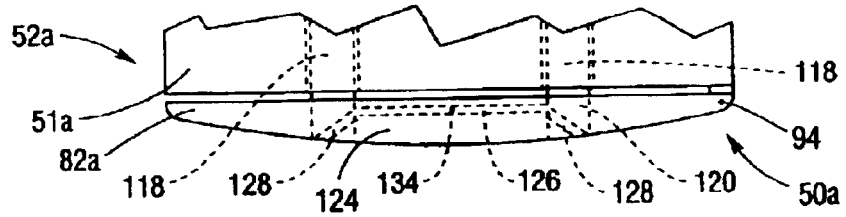
FIG. 4A is a top view of the front end of the cabinet of FIG. 1A having a closed front door and retracted stabilizer.
Figure 4B:
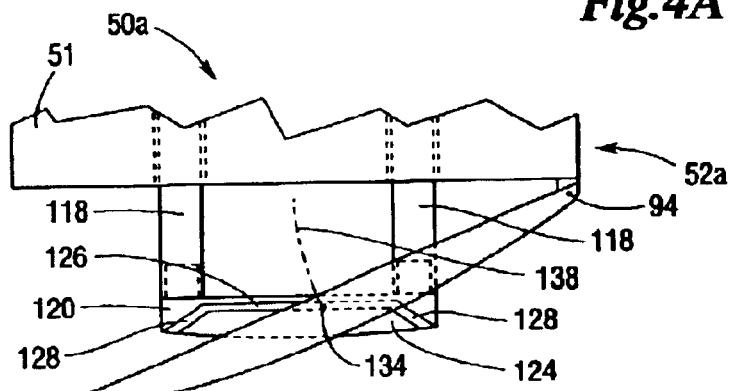
FIG. 4B is a top view of the front end of the cabinet of FIG. 1A having a partially opened front door and a partially extended stabilizer.

FIG. 4A is a top view of the front door 82a and stabilizer 116 configuration of FIG. 3 positioned at the front portion 52a of the cabinet 50a, the front door 82a being in a closed position and the roller pin 134 being in engagement with the pin track 126. When the front door 82a is initially opened, as shown in FIG. 4B, the roller pin 134 travels with the front door 82a along a pin path 138 while maintaining its engagement with the cross member 120 of the stabilizer 116. This engagement exerts an extension force against the pin trap 124 and begins to extend the stabilizer 116 from the fixed base 56a of the cabinet 50a. Thus, as the front door 82a is opened, the stabilizer 116 progressively begins to extend automatically from the fixed base 56a.

Figure 4C:
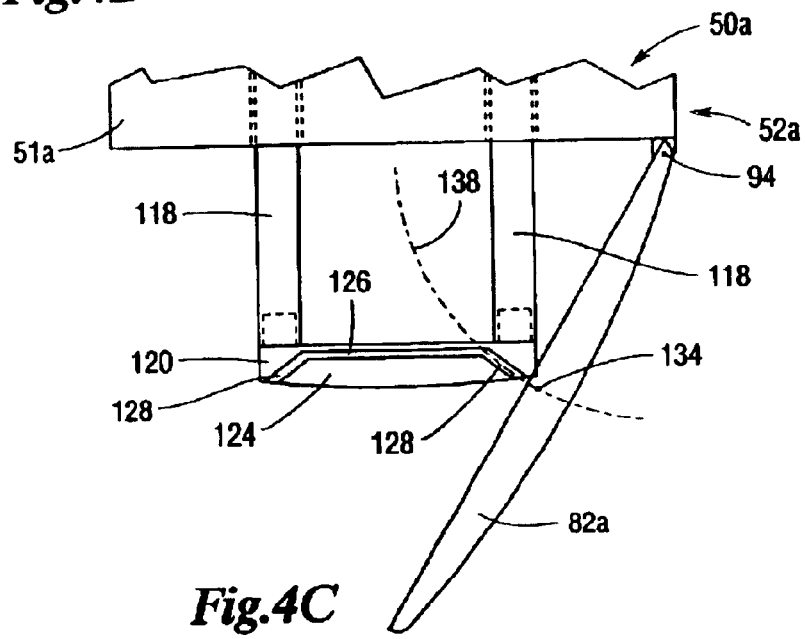
FIG. 4C is a top view of the front end of the cabinet of FIG. 1A having a partially opened front door and a fully extended stabilizer.

As the roller pin 134 travels along the pin path 138, it also moves along the pin track 126 toward the exit point 128 at one end of the pin trap 124. Referring now to FIG. 4C, the roller pin 134 exits the pin track 126at the exit point 128 once the stabilizer 116 is fully extended, automatically disconnecting the front door 82a from engagement with the stabilizer 116. The front door 82a can then continue to swing freely and be opened further without further interfering with the stabilizer, 116. The stabilizer 116 thus acts to extend the support base of the cabinet 50a past the threshold 63 of the front door 82a and allows for greater stability as electrical component boxes are added to the cabinet 50a. The inclusion of exit points 128 at either end of the pin trap 126 also allows the pin 134 to exit the pin track 126 regardless of whether the front door 82a is mounted to open from the left or from the right.

Later, as the front door 82a is being closed, the roller pin 134 can re-enter the pin track 126 through the exit point 128. However, while the front door 82 is in an open position and the cabinet 50a is loaded or unloaded, it is possible that the stabilizer 116 could be bumped or otherwise partially retracted by accident so that an exit point 128 of the pin track 126 would be out of line with the pin path 138. If this were to happen, the roller pin 134 would contact the pin trap 124 as the front door 82a rotated toward the front portion 52a of the cabinet 50a. As best understood by comparing FIG. 2 with FIG. 3, the pin trap 124 is tapered so that if the roller pin 134 were to make contact with any portion of the pin trap 124, the force of the rotating front door 82a would cause the roller pin 134 to exert a compression force against the trap spring 130. This compression force would lower the pin trap 124 on its pivot 132 sufficiently for the roller pin 134 to bypass the pin trap 124 and engage the pin track 126.

Once the roller pin 134 returns to engage the pin track 126, the force of the rotating front door 82a is used to exert retracting forces, exerted through the roller pin 134 against the cross member 120, to retract the stabilizer 116 into the fixed base 56a of the cabinet 50a. Thus, closing the front door 82a automatically retracts the stabilizer 116 into the fixed base 56a of the cabinet 50a regardless of how far the stabilizer 116 has been extended. Retraction of the stabilizer 116 then frees up adjacent floor space until it is again necessary to open the front door 82a to again service electrical component boxes that are stored inside the cabinet 50a.

Figure 5:
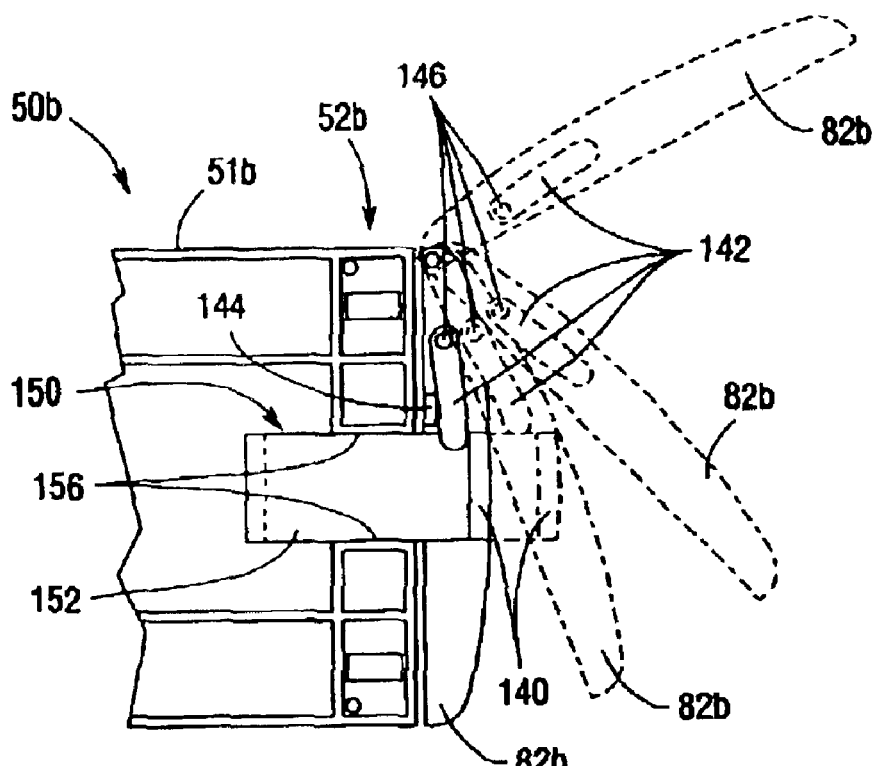
FIG. 5 is a bottom view of a cabinet, stabilizer and front door according to one embodiment of the invention.
Figure 6A:
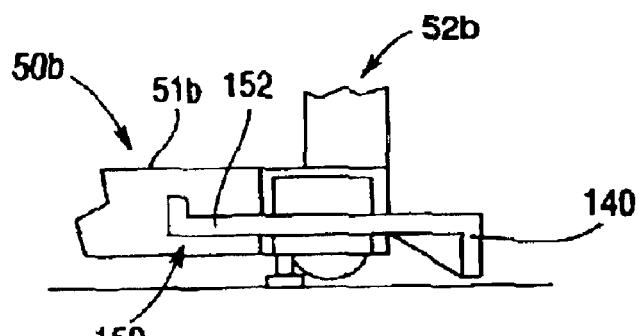
FIG. 6A is a side cross sectional view of the cabinet and stabilizer of FIG. 5 with the stabilizer being retracted.
Figure 6B:
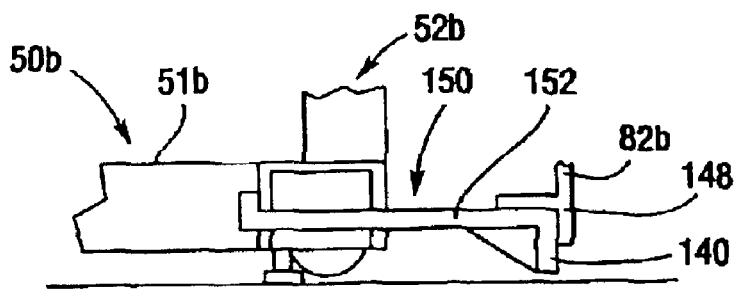
FIG. 6B is a side cross sectional view of the cabinet and stabilizer of FIG. 5 with the stabilizer being extended.

Although the invention has been shown and described as having a stabilizer having a roller pin and pin trap to effect extension and retraction, it will be appreciated that other stabilizer configurations are also possible and are contemplated to be within the scope of the invention. An example of an alternate configuration is depicted in FIGS. 5, 6A and 6B. A stabilizer 150 includes an engagement angle 140 positioned at the end of a stabilizer leg 152. The stabilizer leg 152 is mounted to extend from or to retract into the fixed base 56b of the cabinet 50b between leg guides 156. The front door 82b of the cabinet 50b includes a springing lever 142 that rests against a stop 144 when the front door 82b is in a closed position. The lever 142 is mounted to rotate on a pivot 146 that is in fixed position on the front door 82b. Movement of the lever 142 is restricted with a biasing spring (not shown) that can be located within the pivot 146.

Referring to FIG. 5, the biasing spring does not permit inward rotation of the lever 142 toward the cabinet 50b past the engagement position shown with respect to the front door 82b. The biasing spring does permit limited outward rotation of the lever 142 from the engagement position in a direction that is away from the cabinet 50b. However, such outward rotation is limited in that the lever 142 is biased to rotate inwardly toward the cabinet 50b to the engagement position shown with respect to the front door 82b. Due to this bias by the biasing spring, the lever 142 is also spring biased to remain in contact with the stop 144 while the front door 82b is in the closed position and the lever 142 is in the engagement position. While the front door 82b is closed and the lever 142 is in the engagement position, the lever 142 is also proximate the engagement angle 140.

When the front door 82b is opened, the lever 142, remaining in the engagement position with respect to the front door 82b, contacts and exerts an extension force against the engagement angle 140 to extend the stabilizer 150 and increase the support base of the cabinet 50b. When the stabilizer 150 is fully extended, the fixed position of the pivot 146 travels with the rotating front door 82b, moving the lever 142 away from the reach of the engagement angle 140 and preventing further engagement with the stabilizer 150 while keeping the lever 142 in the engagement position with respect to the door 82b.

After the component boxes of the cabinet 50b have been serviced, the front door 82b can be rotated toward the closed position. If the stabilizer 150 has been bumped or otherwise partially retracted by accident, the lever 142 rotates outward away from the cabinet 50b and away from the engagement position against its spring bias to bypass the engagement angle 140 as the lever 142 and engagement angle 140 make contact.

Referring to the side cross sectional views of FIGS. 6A and 6B, the front door 82b includes an overhang 148 which is configured to contact the engagement angle 140 and force the stabilizer 150 to retract back into the fixed base 56b of the cabinet 50b as the front door 82b returns to its closed position. The lever 142 clears the engagement angle 140 and returns to its engagement position under the force of its spring bias when the door 82b is fully closed.

This invention has been described with reference to specific illustrated embodiments. Many modifications and alterations of these embodiments will occur or become apparent to others upon reading and understanding the preceding specification. It is intended and will be appreciated that this invention is to be construed as including all such alterations and modifications insofar as they come within the spirit and scope of the appended claims or equivalents of these claims.

What is claimed is:

1. A stabilized cabinet for storing vertically stacked items comprising:

a cabinet configured to store a plurality of vertically stacked items, said cabinet having a vertically extending door and a fixed base comprising the support base of said cabinet when said vertical door is closed;

a stabilizer mounted to reciprocate with respect to said cabinet so as to be extendable from about the bottom of said cabinet, said stabilizer being constructed and positioned with respect to said cabinet to expand the support base of said cabinet when said stabilizer is extended from said cabinet;

said door and said stabilizer configured to enable said door to engage and extend said stabilizer from said cabinet as said door is being opened from a closed position and to disengage from said stabilizer when said stabilizer is fully extended; and said door and said stabilizer enabling said door to reengage and retract said stabilizer if said stabilizer has not been fully retracted before said door is closed and allowing said door to return to a position to extend said stabilizer regardless of the position of said stabilizer when said stabilizer is reengaged by said door.

2. The stabilized cabinet of claim 1 further comprising:

said door including a pin extending from a fixed position;

said stabilizer having a pin trap positioned on said stabilizer, said pin configured to exert an extension force on said pin trap and to enable said door to engage and extend said stabilizer from said cabinet as said door is being opened from a closed position and to disengage from said pin trap when said stabilizer is fully extended; and said pin and said pin trap configured to enable said pin to reengage said pin trap and retract said stabilizer if said stabilizer has not been fully retracted before said door is closed and to allow said door to return to a position to extend said stabilizer regardless of the position of said stabilizer when said stabilizer is reengaged by said door.

3. The stabilized cabinet of claim 1 further comprising:

said door including a pin extending from a fixed position;

said stabilizer including a pin trap positioned on said stabilizer, said pin trap having at least one exit point and being positioned to rotate on a pivot and biased to an upward position, said pin configured to exert an extension force on said pin trap and to enable said door to engage and extend said stabilizer from said cabinet as said door is being opened from a closed position and to disengage from said pin trap through said at least one exit point when said stabilizer is fully extended; and said pin configured to exert a compression force against said pin trap to rotate said pin trap on its pivot against its bias to a downward position to reengage said pin trap and retract said stabilizer if said stabilizer has not been fully retracted before said door is closed and to allow said door to return to a position to extend said stabilizer regardless of the position of said stabilizer when said pin trap is reengaged by said pin.

4. The stabilized cabinet of claim 1 further comprising:

said door including a pin extending from a fixed position;

said stabilizer including a pin track positioned on said stabilizer, said pin configured to exert an extension force on said pin track to enable said door to engage and extend said stabilizer from said cabinet as said door is being opened from a closed position and to disengage from said pin track when said stabilizer is fully extended; and said pin and said pin track configured to enable said pin to engage said pin track and retract said stabilizer if said stabilizer has not been fully retracted before said door is closed and to allow said door to return to a position to extend said stabilizer regardless of the position of said stabilizer when said pin track is reengaged by said pin.

5. The stabilized cabinet of claim 1 wherein said stabilizer includes a pair of stabilizer legs and a cross member, said stabilizer legs reciprocally mounted to fit within said fixed base of said stabilizer cabinet, said cross member connecting said stabilizer legs and allowing said stabilizer legs to move in unison when said stabilizer is extended and when said stabilizer is retracted.

6. The stabilized cabinet of claim 1 wherein said stabilizer includes at least one glide leg to support said stabilizer and to allow said stabilizer to slide over floor space adjacent said stabilizer cabinet when said stabilizer is extended and when said stabilizer is retracted.

7. The stabilized cabinet of claim 1 further comprising:

said door including an overhang and a pivoted lever, said lever being biased to an engagement position with and capable of being rotated on said pivot past said engagement position in a direction that is away from said cabinet, said lever being non-rotatable on said pivot past said engagement position in a direction that is toward said cabinet;

said stabilizer having an engagement angle, said lever positioned to engage and exert an extension force on said engagement angle to extend said stabilizer from said cabinet as said door is being opened from a closed position and to disengage from said stabilizer when said stabilizer is fully extended;

said overhang configured to engage said engagement angle when said door is closed, said overhang exerting a retraction force to retract said stabilizer if said stabilizer has not been fully retracted before said door is closed and allowing said door to return to a position to extend said stabilizer regardless of the position of said stabilizer when said engagement angle is reengaged by said overhang; and said lever engaging said engagement angle and rotating on its pivot past its engagement position in a direction that is away from said cabinet to allow said lever to clear said engagement angle when said door is closed, said lever being capable of rotating on its pivot back to its engagement position to reengage said engagement angle when said door is closed.

8. A stabilized cabinet according to claim 1 in which said stabilizer comprises at least one stabilizer leg which substantially fits within said cabinet when said stabilizer is retracted and a cross member attached to said at least one stabilizer leg, said door including an extension for engaging said cross member, said cross member including a track which said extension engages to extend said stabilizer from said cabinet as said door is opened from a closed position and which said extension disengages when said stabilizer is fully extended.

9. A stabilized cabinet according to claim 1 in which said stabilizer comprises at least one stabilizer leg which substantially fits within said cabinet when said stabilizer is retracted and a cross member attached to said at least one stabilizer leg, said door including an extension for engaging said cross member, said cross member including a track which said extension engages to extend said stabilizer from said cabinet as said door is opened from a closed position and which said extension disengages when said stabilizer is fully extended;

a first side of said track constructed to remain firm when contacted by said extension as said stabilizer is being extended, said first side being movable when contacted by said extension after said extension disengages from said track to allow said extension to return to said track as said door is being closed to retract said stabilizer.

10. A stabilized cabinet for storing vertically stacked items comprising:

a cabinet configured to store a plurality of vertically items, said cabinet having a vertically extending door and a fixed base comprising the support base of said cabinet when said vertical door is closed;

a roller pin extending from a fixed position on said door;

a stabilizer mounted to reciprocate with respect to said cabinet so as to be extendable from about the bottom of said cabinet, said stabilizer constructed and positioned with respect to said cabinet to expand the support base of said cabinet when said stabilizer is extended from said cabinet, said stabilizer including a pair of stabilizer legs and a cross member, said stabilizer legs reciprocally mounted to fit within said fixed base of said stabilizer cabinet, said cross member connecting said stabilizer legs and allowing said stabilizer legs to move in unison when said stabilizer is extended and when said stabilizer is retracted, said stabilizer including at least one glide leg to support said stabilizer and to allow said stabilizer to slide over floor space adjacent said stabilizer cabinet when said stabilizer is extended and when said stabilizer is retracted;

a pin trap and a pin track, said pin trap and said pin track each adjacently positioned on said stabilizer, said pin trap having at least one exit point and being positioned to rotate on a pivot and biased to an upward position, said roller pin being configured to exert an extension force on said pin trap and to enable said door to engage and extend said stabilizer from said cabinet as said door is being opened from a closed position and to disengage from said pin trap through said at least one exit point when said stabilizer is fully extended; and said roller pin configured to exert a compression force against said pin trap to rotate said pin trap on its pivot against its bias to a downward position to reengage said pin trap and retract said stabilizer if said stabilizer has not been fully retracted before said door is closed and allowing said door to return to a position to extend said stabilizer regardless of the position of said stabilizer when said pin trap is reengaged by said roller pin.

11. A stabilizer for a cabinet used for storing vertically stacked items, the cabinet having a vertically extending door and a fixed base comprising the support base of the cabinet when the vertical door is closed, said stabilizer comprising:

said stabilizer adapted to be mounted to reciprocate with respect to the cabinet so as to be extendable from about the bottom of the cabinet, said stabilizer being constructed to be positioned with respect to the cabinet to expand the support base of the cabinet when said stabilizer is extended from the cabinet;

said stabilizer configured to be engaged by the door and to be extended from the cabinet as the door is being opened from a closed position, said stabilizer adapted to be positioned to be disengaged from the door when said stabilizer is fully extended; and said stabilizer adapted to be reengaged by the door and be retracted if said stabilizer has not been fully retracted before the door is closed and to allow the door to return to a position to extend said stabilizer regardless of the position of said stabilizer when said stabilizer is reengaged by the door.

12. The stabilizer of claim 11 wherein:

a pin adapted to extend from a fixed position on the door of the cabinet;

said stabilizer having a pin trap positioned on said stabilizer, the pin trap configured to be engaged by said pin to enable the door to exert an extension force and extend said stabilizer from the cabinet as the door is being opened from a closed position, and to allow the pin to disengage from said pin trap when said stabilizer is filly extended; and said pin trap configured to enable the pin to reengage said pin trap and retract said stabilizer if said stabilizer has not been filly retracted before the door is closed to allow the door to return to a position to extend said stabilizer regardless of the position of said stabilizer when said stabilizer is reengaged by the pin.

13. The stabilizer of claim 11 wherein:

a pin adapted to extend from a fixed position on the door of the cabinet;

said stabilizer includes a pin trap positioned on said stabilizer, said pin trap having at least one exit point and being positioned to rotate on a pivot and biased to an upward position, the pin trap configured to be engaged by said pin to enable the door to exert an extension force and extend said stabilizer from the cabinet as the door is being opened from a closed position and to enable the pin of the door to disengage from said pin trap through said at least one exit point when said stabilizer is fully extended; and the pin trap configured to receive a compression force from the pin to rotate said pin trap on its pivot against its bias to a downward position to allow the pin to reengage said pin trap and retract said stabilizer if said stabilizer has not been fully retracted before the door is closed and to allow the door to return to a position to extend said stabilizer regardless of the position of said stabilizer when said pin trap is reengaged by the pin.

14. The stabilized cabinet of claim 11 wherein:

a pin adapted to extend from a fixed position on the door of the cabinet;

said stabilizer includes a pin track positioned on said stabilizer, said pin track configured to be engaged by said pin to enable the door to exert an extension force and extend said stabilizer from the cabinet as the door is opened from a closed position, and to enable the pin to disengage from said pin track when said stabilizer is fully extended; and said pin track configured to enable the pin to engage said pin track and retract said stabilizer if said stabilizer has not been fully retracted before the door is closed to allow the door to return to a position to extend said stabilizer regardless of the position of said stabilizer when said pin track is reengaged by the pin.

15. The stabilizer of claim 11 wherein said stabilizer includes a pair of stabilizer legs and a cross member, said stabilizer legs adapted to be reciprocally mounted to fit within the fixed base of the stabilizer cabinet, said cross member connecting said stabilizer legs and allowing said stabilizer legs to move in unison when said stabilizer is extended and when said stabilizer is retracted.

16. The stabilizer of claim 11 wherein said stabilizer includes at least one glide leg to support said stabilizer and to allow said stabilizer to slide over floor space adjacent the stabilized cabinet when said stabilizer is extended and when said stabilizer is retracted.

17. The stabilizer of claim 11, the door of the cabinet including an overhang and a pivoted lever, the lever being biased to an engagement position with and capable of being rotated on the pivot past the engagement position in a direction that is away from the cabinet, the lever being non-rotatable on the pivot past said engagement position in a direction that is toward the cabinet, the stabilizer further comprising:

an engagement angle, said engagement angle positioned to be engaged by the lever of the door to enable the door to exert an extension force to extend said stabilizer from the cabinet as the door is being opened from a closed position and to disengage from the lever of the door when said stabilizer is fully extended;

said engagement angle being positioned to be reengaged by the overhang of the door when the door is closed, the stabilizer receiving a retraction force to be retracted by the overhang if said stabilizer has not been fully retracted before the door is closed and to allow the door to return to a position to extend said stabilizer regardless of the position of said stabilizer when said engagement angle is reengaged by the overhang; and said engagement angle engaged by the lever of the door, the lever rotating on its pivot past its engagement position in a direction that is away from the cabinet to allow the lever to clear said engagement angle when the door is closed, said engagement angle reengaged by the lever when the lever rotates on its pivot back to its engagement position to reengage said engagement angle when the door is closed.

18. A stabilized cabinet according to claim 11 in which said stabilizer comprises at least one stabilizer leg which is adapted to fit substantially within the cabinet when said stabilizer is retracted and a cross member attached to said at least one stabilizer leg, said cross member being adapted to be engaged by an extension of the door, said cross member including a track which the extension engages to extend said stabilizer from the cabinet as the door is opened from a closed position the extension disengaging the track when said stabilizer is fully extended.

19. A stabilized cabinet according to claim 11 in which said stabilizer comprises at least one stabilizer leg which is adapted to fit substantially within the cabinet when said stabilizer is retracted and a cross member attached to said at least one stabilizer leg, said cross member being adapted to be engaged by an extension of the door, said cross member including a track which the extension engages to extend said stabilizer from the cabinet as the door is opened from a closed position, the extension disengaging the track when said stabilizer is filly extended;

a first side of said tack constructed to remain firm when contacted by the extension as said stabilizer is being extended, said first side being movable when contacted by the extension after the extension disengages from said track to allow the extension to return to said track as the door is closed to retract said stabilizer.

20. A stabilizer for storing vertically stacked items in a cabinet, the cabinet having a vertically extending door and a fixed base comprising the support base of said cabinet when the vertical door is closed, a roller pin adapted to extend from a fixed position on the door, said stabilizer comprising:

said stabilizer adapted to be mounted to reciprocate with respect to the cabinet so as to be extendable from about the bottom of the cabinet, said stabilizer constructed to be positioned with respect to the cabinet to expand the support base of the cabinet when said stabilizer is extended from the cabinet, said stabilizer including a pair of stabilizer legs and a cross member, said stabilizer legs adapted to be reciprocally mounted to fit within the fixed base of the stabilizer cabinet, said cross member connecting said stabilizer legs and allowing said stabilizer legs to move in unison when said stabilizer is extended and when said stabilizer is retracted, said stabilizer including at least one glide leg to support said stabilizer and to allow said stabilizer to slide over floor space adjacent the stabilized cabinet when said stabilizer is extended and when said stabilizer is retracted;

a pin trap and a pin track, said pin trap and said pin track each adjacently positioned on said stabilizer, said pin trap having at least one exit point and being positioned to rotate on a pivot and biased to an upward position, said pin trap being positioned to be engaged by the roller pin to enable the door to exert an extension force and extend said stabilizer from the cabinet as the door is being opened from a closed position, said pin trap being further positioned to have the roller pin disengage from said pin trap through said at least one exit point what said stabilizer is fully extended; and the pin trap configured to receive a compression force from the roller pin to rotate said pin trap on its pivot against its bias to a downward position to be reengaged by said roller pin to retract said stabilizer if said stabilizer has now been fully retracted before the door is closed and to allow the door to return to a position to extend said stabilizer regardless of the position of said stabilizer when said pin trap is reengaged by the roller pin.

* * * * *

UNITED STATES PATENT AND TRADEMARK OFFICE
CERTIFICATE OF CORRECTION

| | |
|---|---|
| PATENT NO. | : 6,857,711 B1 |
| APPLICATION NO. | : 10/249380 |
| DATED | : February 22, 2005 |
| INVENTOR(S) | : Albert E. Straus |

It is certified that error appears in the above-identified patent and that said Letters Patent is hereby corrected as shown below:

Column 1,
Line 35, delete "10/282,881" and add -- 10/282,887 --.

Column 3,
Line 31, delete "top brace 12" and add -- top brace 72 --.
Line 58, add -- stabilizer legs 118 that are -- before "reciprocally".

Column 4,
Line 4, delete "pin track 116" and add -- pin track 126 --.
Line 6, delete "stabilizer 126" and add -- stabilizer 116 --.

Column 10,
Line 50, delete "to reengage said engagement angle" after "engagement position".

Signed and Sealed this

Twenty-seventh Day of June, 2006

JON W. DUDAS
*Director of the United States Patent and Trademark Office*

UNITED STATES PATENT AND TRADEMARK OFFICE
CERTIFICATE OF CORRECTION

PATENT NO. : 6,857,711 B1  Page 1 of 1
APPLICATION NO. : 10/249380
DATED : February 22, 2005
INVENTOR(S) : Albert E. Straus It is certified that error appears in the above-identified patent and that said Letters Patent is hereby corrected as shown below:

Column 1, line 35    delete "10/282,881" and add "10/282,887"

Column 3, line 31    delete "top brace 12" and add "top brace 72"

Column 3, line 58    add "stabilizer legs 118 that are" in front of "reciprocally"

Column 4, line 4     delete "pin track 116" and add "pin track 126"

Column 4, line 6     delete "stabilizer 126" and add "stabilizer 116"

Column 10, line 50   delete " to reengage said engagement angle" after the words "engagement position"

Signed and Sealed this

Eighth Day of August, 2006

JON W. DUDAS
*Director of the United States Patent and Trademark Office*